(12) United States Patent
Wong

(10) Patent No.: US 7,023,227 B1
(45) Date of Patent: Apr. 4, 2006

(54) APPARATUS FOR SOCKETING AND TESTING INTEGRATED CIRCUITS AND METHODS OF OPERATING THE SAME

(75) Inventor: Kern W. Wong, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 400 days.

(21) Appl. No.: 10/075,832

(22) Filed: Feb. 12, 2002

(51) Int. Cl.
*G01R 31/02* (2006.01)

(52) U.S. Cl. ....................... 324/760; 324/754
(58) Field of Classification Search ........ 324/754–758, 324/761, 762, 765, 158.1; 374/208; 700/300
See application file for complete search history.

(56) References Cited

U.S. PATENT DOCUMENTS

| | | | | | |
|---|---|---|---|---|---|
| 3,710,251 | A | * | 1/1973 | Hagge et al. | 324/760 |
| 4,734,872 | A | * | 3/1988 | Eager et al. | 700/300 |
| 4,782,291 | A | * | 11/1988 | Blandin | 324/158.1 |
| 4,926,117 | A | * | 5/1990 | Nevill | 324/760 |
| 4,945,302 | A | * | 7/1990 | Janum | 324/73.1 |
| 4,962,355 | A | * | 10/1990 | Holderfield et al. | 324/760 |
| 5,086,269 | A | * | 2/1992 | Nobi | 324/760 |
| 5,331,273 | A | * | 7/1994 | Schneider | 324/158.1 |
| 5,451,884 | A | * | 9/1995 | Sauerland | 324/760 |
| 5,929,651 | A | * | 7/1999 | Leas et al. | 324/765 |
| 5,952,840 | A | * | 9/1999 | Farnworth et al. | 324/755 |
| 6,114,868 | A | * | 9/2000 | Nevill | 324/760 |
| 6,157,201 | A | * | 12/2000 | Leung, Jr. | 324/760 |
| 6,169,409 | B1 | * | 1/2001 | Amemiya | 324/754 |
| 6,288,561 | B1 | * | 9/2001 | Leedy | 324/760 |
| 6,322,626 | B1 | * | 11/2001 | Shirley | 118/73 |
| 6,329,831 | B1 | * | 12/2001 | Bui et al. | 324/765 |
| 6,501,290 | B1 | * | 12/2002 | Kvanvig et al. | 324/760 |

* cited by examiner

*Primary Examiner*—Vinh Nguyen
*Assistant Examiner*—Russell M Kobert

(57) ABSTRACT

There is disclosed apparatus for socketing and testing integrated circuits, particularly RF and high-frequency integrated circuits in high density and fine pitch packages, and methods of operating the same. An exemplary apparatus includes an air machine and a housing. The housing includes a universal printed circuit board that is operable to receive a device under test, a controller that is operable to control testing of the received device under test, and a power supply. The housing and the air machine are associable to form an at least substantially air-tight chamber ensconcing the received device under test.

20 Claims, 3 Drawing Sheets

APPARATUS FOR SOCKETING AND TESTING INTEGRATED CIRCUITS AND METHODS OF OPERATING THE SAME

TECHNICAL FIELD OF THE INVENTION

The present invention is directed to apparatus for socketing and testing integrated circuits, particularly RF and high-frequency integrated circuits, and methods of operating the same.

BACKGROUND OF THE INVENTION

An integrated circuit ("IC") may be defined broadly as any small electronic device comprising semiconductor material. ICs are designed to meet certain design specifications and are often classified by the number of transistors and other electronic components they contain.

ICs are tested during their respective design, development and manufacture stages to identify and eliminate potential defects. Such testing is commonly performed in a non-destructive manner to determine whether the ICs under test meet their respective specifications. For instance, assuming a relatively simple device (e.g., a device with only a few input and output terminals or "pins"), testing may involve applying signals to the input terminals, measuring the response on the output terminals, and comparing the actual response to the designed response. As errors are observed between the designed and actual output signal states, design problems in the ICs or in the load board may be pinpointed and remedied.

Over the years, the semiconductor industry has had a constant challenge maintaining its pace with the advances in IC-packaging technology. This challenge is exacerbated when evaluating radio-frequency ("RF") ICs due to their heightened sensitivity to parasitic elements and requirement of "good" matching (e.g., input/output ("I/O") impedance, interconnect, support components, etc.).

One common socket and test approach, for instance, utilizes a conventional clamping mechanism to securing "tssop"-IC packages to printed circuit boards ("PCBs"). This approach is cumbersome and fails to provide a mechanism to aid registration of device pins to pads on the PCB, thereby requiring an operator to align device pins with the pads by trial and error. Further, the jigs used for socketing the device under test ("DUT") commonly require manual mechanical adjustments.

Another more contemporary approach utilizes a "drill-press" like jig to accommodate ball-grid array and quad-flat-pack packaged devices. This approach is also cumbersome and the jig often prohibits die probing and significantly interferes with environmental stress testing. In contrast to the prior approach which utilized a large lever mechanism (commonly from below the DUT board) to effect the press action, this more contemporary approach utilizes a soft adjustable tension plunger (commonly from above the DUT board).

A further complication is that PCBs used in the test platforms are not standardized (e.g., general dimensions, plating parameter, I/O port spacing, etc.), as each engineer typically designs their "PCB" to fit a particular DUT. There is therefore a need in the art for an apparatus for socketing and testing a DUT having suitable tolerance control over electro-mechanical contact between pad and pin. There is a further need in the art for a universal core PCB employed with standard I/O connectors for use with DUTs. There is a yet further need in the art for standardized sockets developed for dual-in-line "tssop" and quad-flat-pack packages to replace the bulky clamping mechanisms widely used in the semiconductor industry.

SUMMARY OF THE INVENTION

To address the above-discussed deficiencies of the prior art, it is a primary object of the present invention to provide apparatus for socketing and testing ICs, particularly RF and high-frequency ICs in high density and fine pitch packages (i.e., chip scale, tssop, tqfp, etc.), and methods of operating the same.

According to an advantageous embodiment hereof, an apparatus is introduced for socketing and testing ICs, and includes an air machine and a housing. The housing includes a universal PCB that is operable to receive a DUT, a controller that is operable to control testing of the received DUT, and a power supply. The housing and the air machine are associable to form an at least substantially air-tight chamber ensconcing the received DUT.

According to an advantageous embodiment, the PCB is circular in shape, and the housing further includes I/O connectors that are placed circumferentially and symmetrically near the edge of the universal printed circuit board. In a related embodiment, the PCB includes a leadless, self-registering socket that is operable to receive the DUT and its support components (if any) in the center of the PCB. The PCB may advantageously include gold fuse dotted arrays embedded in soft membrane which can be used as contactors in sockets for ball grid array packages.

It is important to note that the self-registering and leadless socket adds no additional inductance between the DUT and the PCB during operation. Further, use of a clamp-shell top with a large center opening enables both a thermally/cryo-genically treated air stream to blanket the DUT, and micro-probing of the DUT. In addition, it is desirable to have an at least substantially air-tight seal between the air machine and the housing to prevent moisture buildup, icing or the like.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention.

Figure 1:
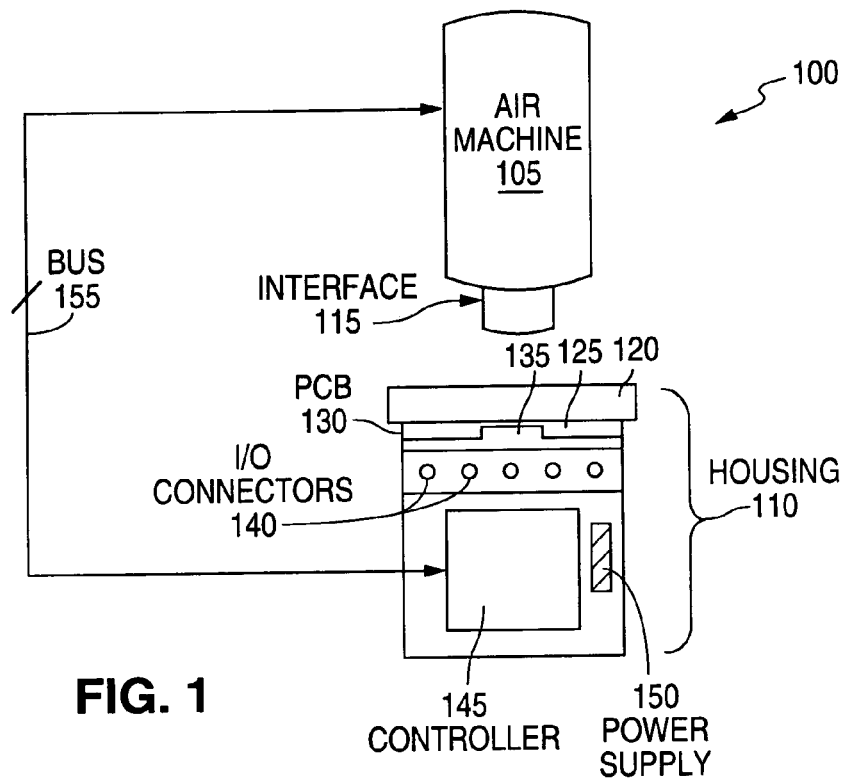
FIG. 1 illustrates a block diagram of a side-profile view of an exemplary apparatus for socketing and testing an integrated circuit in accordance with one embodiment of the present invention.

FIG. 1 illustrates a block diagram of a side profile view of an exemplary apparatus (generally designated 100) for socketing and testing an IC 135 in accordance with one embodiment of the present invention. In operation, apparatus 100 is at least substantially self-contained and operates to test ICs (and is particularly well suited for testing RF and high-frequency semiconductor devices). Apparatus 100 illustratively includes a conventional suitably arranged air machine 105 and housing 110.

Exemplary air machine 105 operates to controllably provide thermally-varying air flow and includes an interface 115. According to the illustrated embodiment, interface 115 has a circular design that enables a direct and convenient association with test housing 110. Those of ordinary skill in the art will understand that any device for providing a controlled thermally-varying test environment is within the scope of the present invention.

Exemplary housing 110 illustratively includes a first housing-layer 120, a second housing-layer 125, a PCB 130, a DUT 135, I/O connectors 140, a controller 145 and a power supply 150. Exemplary first and second housing-layers 120; 125, as well as the remainder of housing 110 are made from one or more physiologically acceptable materials suitable for IC-testing apparatus.

According to the illustrated implementation, first housing-layer 120 is associated with second housing-layer 125 and includes an aperture (shown in FIGS. 2 and 3) that is sized and shaped to mate with interface 115. According to the present embodiment, interface 115 includes a suitably arranged insulating gasket that operates to at least substantially seal the association of interface 115 with the aperture of first housing-layer 120. It is desirable to have an at least substantially air-tight seal between interface 115 and first housing-layer 120 to prevent moisture buildup, icing or the like.

Exemplary PCB 130 is a universal circular core PCB employed with standard SMA I/O connectors 140 placed circumferentially and symmetrically near the edge of PCB 130. According to the present embodiment, PCB 130 advantageously includes (i) a plurality of "leadless" sockets developed for dual in-line "tssop" and quad-flat-pack packages that are used in place of the above-described clamping mechanisms widely used in the PRIOR ART, and (ii) gold-fuse-dotted arrays that are used as contactors in sockets for ball-grid array packages.

Exemplary DUT 135 may be any circuit in which active or passive elements are fabricated and selectively connected on a substrate, and may advantageously include RF or other high-frequency semiconductor devices. DUT 135 and any support components are preferably centered on PCB 130.

Exemplary I/O connectors 140 illustratively provide standardized SMA I/O ports configured radially at the perimeter of circular PCB 130 to facilitate signal line trace matching and minimize parasitic element coupling.

Exemplary controller 145 illustratively is a micro-controller/sequencer operable to configure (i.e., program) DUT 135 or support components settings. According to the illustrated embodiment, controller 145 may, by way of example, be a NSC-COP*ACC (available from NATIONAL SEMICONDUCTOR CORPORATION located in Santa Clara, Calif.), that is fully integrated into apparatus 100. An important aspect hereof is the use of integrated controller 145 to obviate the use of distributed computing/monitoring resources, which tend to generate, often intense, RF signals that may interfere with the testing of DUT 130. Those of ordinary skill in the art will understand, depending upon the implementation, that any computing/monitoring resource, whether distributed or centralized, whether integrated or not, may suitably be used in place of or in cooperation with controller 145 without varying the scope of the present invention in its broadest terms. Controller 145 and air machine 105 are illustratively connected via bus 155.

Exemplary power supply 150 is a built-in battery that operates to power DUT 135. Built-in power supply 150 reduces unwanted noise generated by external power supplies and AC adapters, and facilitates use of apparatus 100 for portable applications. In practice, switch circuits powered by the exemplary battery source may cause the supply voltage to deviate significantly above and below the normal value. To the contrary, use of a lab power supply to perform DUT testing often leads to erroneous/unrealistic results as the relatively high capacity and well regulated lab power supply often does not fluctuate under normal circumstances.

Finally, it should be noted that the illustrated implementation may be suitable for use in an electrostatic and magnetic ("E&M") shielded chamber, as apparatus 100 provides a sufficiently self-contained test jig suitable for use inside a Faraday Cage for accurate measurements.

Figure 2:
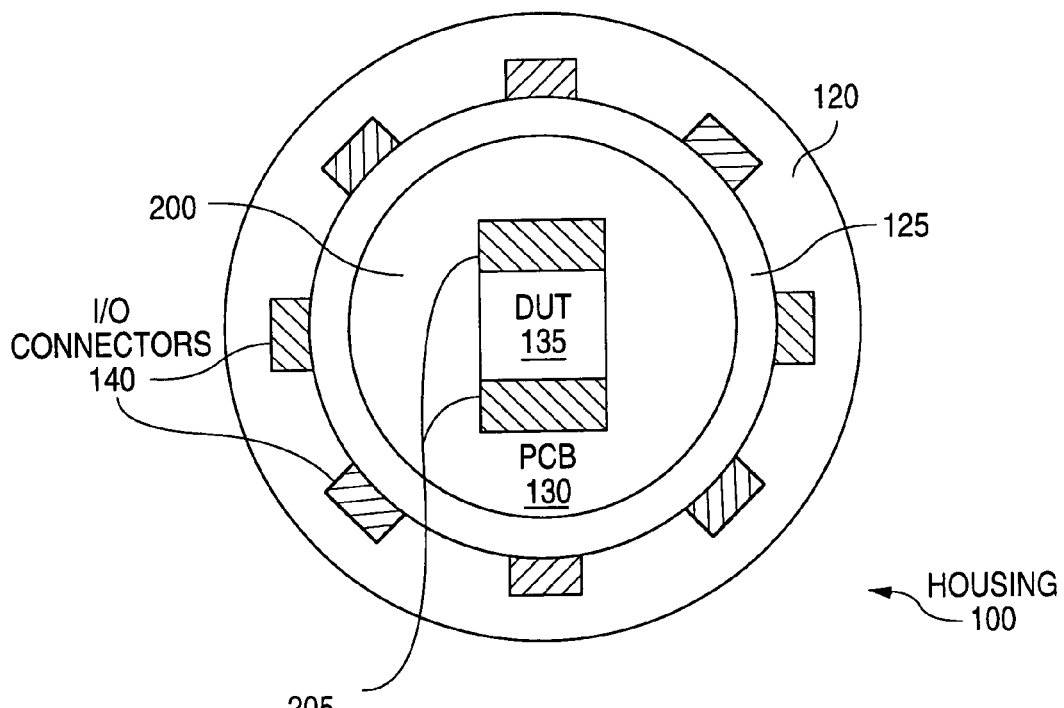
FIG. 2 illustrates a block diagram of a top view of the apparatus for socketing and testing an integrated circuit as set forth in the embodiment of the present invention depicted in FIG. 1.

FIG. 2 illustrates a block diagram of a top view of housing 110 of apparatus 100 for socketing and testing DUT 135 as previously set forth in the embodiment depicted in FIG. 1. First housing-layer 120 is associated with second housing-layer 125 and includes an aperture 200 that is sized and shaped to mate with interface 115 of FIG. 1.

DUT 135 is illustratively socketed and at least substantially centered on PCB 130. PCB 130 is suitably positioned and supported above I/O connectors 140 (e.g., standardized SMA I/O ports) which are configured radially at the perimeter of circular PCB 130 to facilitate signal line trace matching and minimize parasitic element coupling. Again, the socket is preferably self-registering and leadless to add no additional inductance between PCB 130 and DUT 135.

DUT 135 is fixably associated with PCB 130 illustratively using a clamp-shell top 205 having a large center opening that allows (i) a thermally/cryogenically treated air stream from air machine 105 to "blanket" DUT 135, and (ii) micro-probing. Those of ordinary skill in the art will understand, depending upon the implementation, that any suitable socketing approach may be implemented that enables environmental testing without varying the scope of the present invention in its broadest terms. For instance, two exemplary styles of sockets are the "gull-wing" and "screw" methods, each using thin plastic slabs mounted directly on top of PCB 130.

Figure 3:
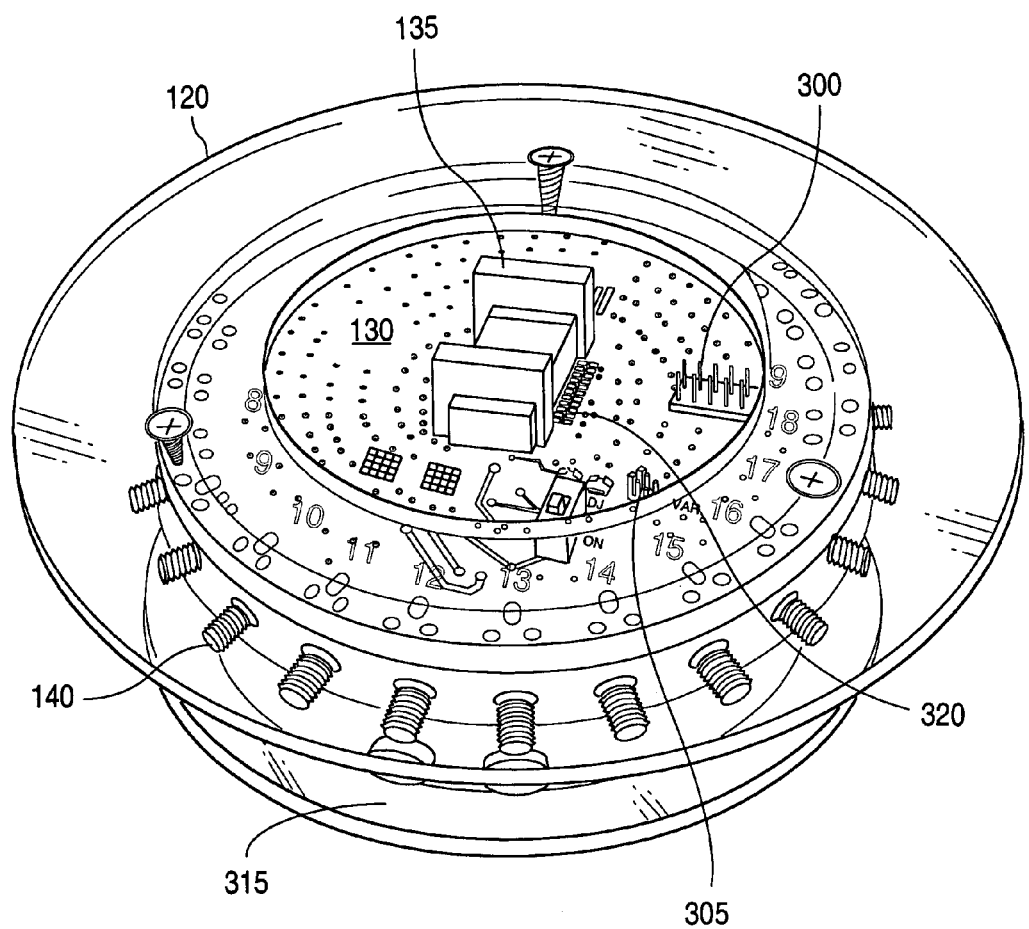
FIG. 3 illustrates an isometric view of the apparatus for socketing and testing an integrated circuit as set forth in the embodiment of the present invention depicted in FIGS. 1 and 2.

FIG. 3 illustrates an isometric view of housing 110 of apparatus 100 for socketing and testing DUT 135 as previously set forth in the embodiment depicted in FIGS. 1 and 2. For purposes of illustration, (i) DUT 135 is associated with PCB 130 via socket 320 which is self-registering and leadless; (ii) PCB 130 is further shown to include a digital bus interface to a computer 300 and jumpers to set commonly used voltages 305; and (iii) housing 110 further includes terminals for a battery charger or external power supply 315.

According to an advantageous embodiment hereof, the metallurgical composition of the conductors and dielectric material of PCB 130 to achieve optimal contact and flatness for the top surface metal finish are as follows: (i) from insulator (e.g., fiber glass or polyamide) start with approximately a 0.1 mil copper thickness; (ii) plate the copper up to 4.0 mil thick minimum; (iii) nickel plate (bright nickel) 250 micro inches, 350 micro inches preferred on copper; and (iv) plate hard gold 70 micro inches thick minimum, 100 micro inches preferred on nickel.

It is preferred that a pulse-plating (non-DC plating) process is used to attain better electrical characteristics, namely, lower impedance, higher atomic packing density, uniform distribution and flatness of the finished metal layer, which improves high frequency performance. This approach also improves the mechanical strength so that repeated pressure from contacting device pin onto a metal pad tends not to lead to accelerated metal fatigue as in conventional plating processes.

Figure 4:
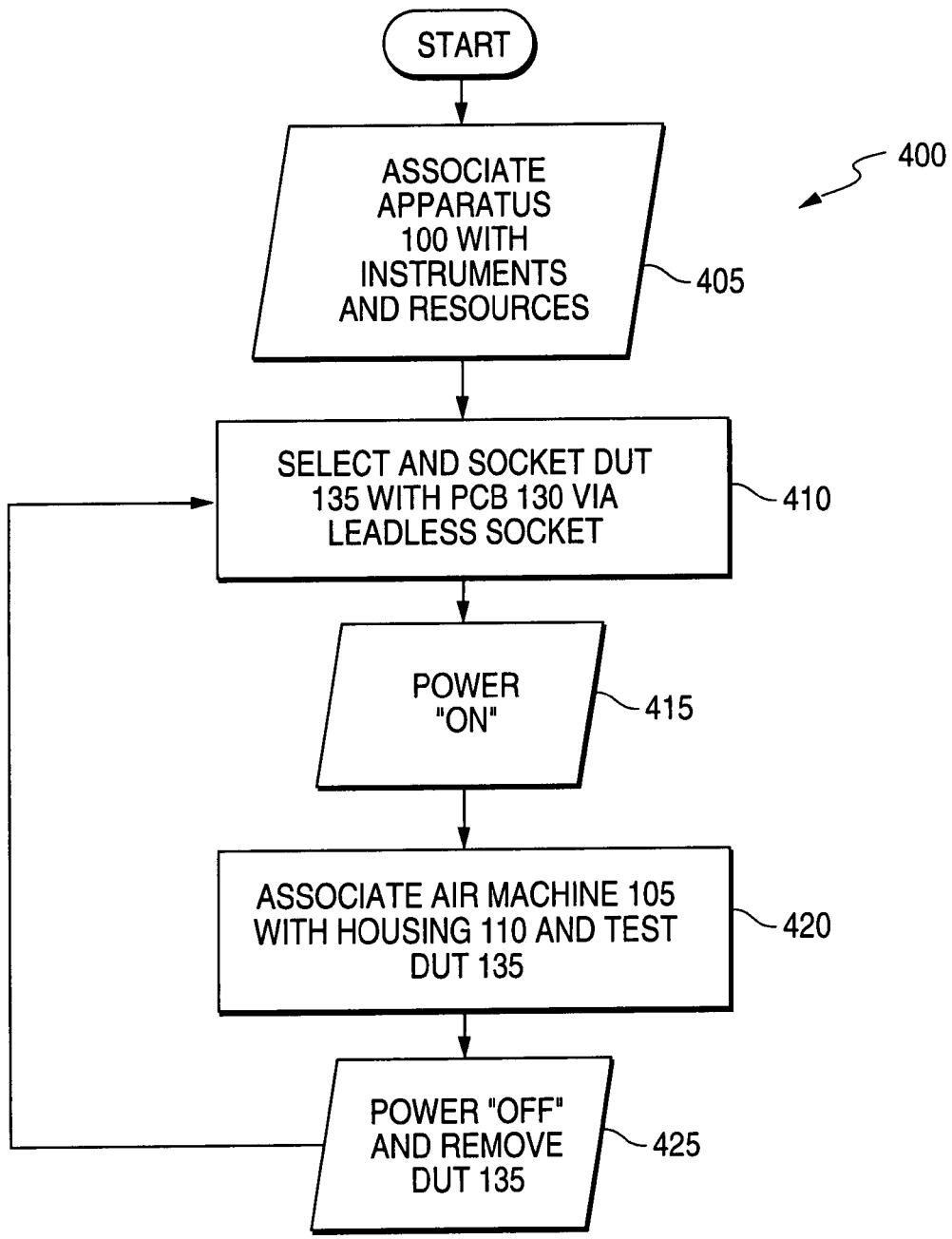
FIG. 4 illustrates a flow diagram of an exemplary method of operating the apparatus of FIGS. 1 to 3 according to one embodiment of the present invention.

FIG. 4 illustrates a flow diagram (generally designated 400) of an exemplary method of operating apparatus 100 of FIGS. 1 to 3 according to one embodiment of the present invention. For purposes of illustration, concurrent reference is made to the embodiment of apparatus 100 of FIGS. 1 to 3.

Initially, either manually or via computer automation, I/O device pins are attached to stimuli and data capture/processing instruments via SMA connectors 140 and the desired instruments setting controls are set, and the serial control data bus is connected to a computing/monitoring resource (process step 405; these actions are illustrative in nature only, and will depend on the nature of the DUT).

Next, either manually or via robotic arm, DUT 135 is selected and associated with socket cavity 320 of PCB 130 via "leadless" socket onto PCB 130 (process step 410); integrated power supply 150 is powered "ON" (process step 415); air machine 105 is associated with housing 110 creating an air-tight seal, the desired temperature(s) and cycle times are set and test stimuli are applied to DUT 135 and the desired response data is captured (process step 420); and, finally, integrated power supply 150 is powered "OFF" and DUT 135 is removed (process step 425).

According to the illustrated embodiment, the testing may suitably include applying both signal and pulse stimuli to test apparatus 100 during varying thermal conditions to enable logic, spectrum, phase-noise, phase-error and other like analysis of DUT 135. Apparatus 100 introduces a self-contained test apparatus for ICs, and, in particular RF and high frequency semiconductor devices.

Although the present invention has been described in detail, those skilled in the art should understand that they can make various changes, substitutions and alterations herein without departing from the spirit and scope of the invention in its is broadest form.

What is claimed is:

1. An apparatus for socketing and testing integrated circuits comprising:
  an air machine that is operable to controllably provide a thermally-varying air flow; and
  a housing comprising (i) a printed circuit board that is operable to receive a device under test, the printed circuit board comprising a leadless socket operable to receive the device under test, and (ii) a controller that is operable to control testing of the received device under test;
  wherein said air machine is associable with said housing to form an at least substantially air-tight chamber ensconcing the received device under test.

2. The apparatus as set forth in claim 1 wherein said housing further comprises a power supply.

3. The apparatus as set forth in claim 1 wherein said printed circuit board is circular shaped.

4. The apparatus as set forth in claim 3 wherein said housing further comprises input/output (I/O) connectors that are placed circumferentially and symmetrically near the edge of the printed circuit board.

5. The apparatus as set forth in claim 3 wherein the leadless socket is self-registering.

6. The apparatus as set forth in claim 5 wherein said leadless socket is operable to receive the device under test in a center of the printed circuit board.

7. A method of operating an apparatus for socketing and testing integrated circuits, said apparatus comprising an air machine and a housing, said housing comprising a printed circuit board and a controller, said method comprising the steps of:
  (i) receiving a device under test at the printed circuit board, the printed circuit board comprising a leadless socket operable to receive the device under test, and
  (ii) associating said air machine with said housing to form an at least substantially air-tight chamber ensconcing the received device under test, the air machine operable to controllably provide a thermally-varying air flow.

8. The method as set forth in claim 7 wherein said housing further comprises a power supply, and said method comprising the step of powering on the apparatus.

9. The method as set forth in claim 7 wherein said printed circuit board is circular shaped, and said method comprising the step of controlling testing of the received device under test with said controller.

10. The method as set forth in claim 9 wherein said housing further comprises input/output (I/O) connectors that are placed circumferentially and symmetrically near the edge of the printed circuit board.

11. The method as set forth in claim 9 wherein the leadless socket is self-registering.

12. The method as set forth in claim 11 wherein said leadless socket is operable to receive the device under test in a center of the printed circuit board.

13. The method of claim 7, further comprising setting one or more desired temperatures and one or more desired cycle times for a test of the integrated circuits.

14. An apparatus for socketing and testing integrated circuits comprising:
- an air machine that is operable to controllably provide a thermally-varying air flow; and
- a housing comprising (i) a universal printed circuit board that is operable to receive a device under test, the printed circuit board comprising a leadless socket operable to receive the device under test, (ii) a controller that is operable to control testing of the received device under test, and (iii) a power supply;
- wherein said air machine is associable with said housing to form an at least substantially air-tight chamber ensconcing the received device under test.

15. The apparatus as set forth in claim 14 wherein said power supply is a battery.

16. The apparatus as set forth in claim 14 wherein said universal printed circuit board is circular shaped.

17. The apparatus as set forth in claim 16 wherein said housing further comprises input/output (I/O) connectors that are placed circumferentially and symmetrically near the edge of the universal printed circuit board.

18. The apparatus as set forth in claim 14 wherein said leadless socket is operable to receive the device under test in a center of the printed circuit board.

19. The apparatus as set forth in claim 14 wherein the device under test is one of a radio frequency (RF) integrated circuit and a high-frequency integrated circuit.

20. The apparatus as set forth in claim 14 wherein said leadless socket is self-registering.

* * * * *